United States Patent [19]

Koinuma et al.

[11] Patent Number: 5,075,282

[45] Date of Patent: Dec. 24, 1991

[54] PRINTING METHOD OF FORMING OXIDE SUPERCONDUCTING FILMS ON $LA_2CU\ O_4$ SUBSTRATES

[75] Inventors: Hideomi Koinuma, Tokyo; Takuya Hashimoto, Narashino; Fueki Kazuo, Tokyo, all of Japan

[73] Assignees: Semiconductor Energy Laboratory Co., Ltd., Kanagawa; Hideomi Koinuma, Tokyo, both of Japan

[21] Appl. No.: 423,529

[22] Filed: Oct. 16, 1989

Related U.S. Application Data

[63] Continuation of Ser. No. 170,247, Mar. 18, 1988, abandoned.

[30] Foreign Application Priority Data

Mar. 20, 1987 [JP] Japan ................................. 62-64288

[51] Int. Cl.$^5$ .......................... B05D 3/02; B05D 5/12
[52] U.S. Cl. ........................................ 505/1; 505/741; 427/62; 427/282
[58] Field of Search .................... 505/1, 741, 739; 427/62, 63, 96, 282

[56] References Cited

U.S. PATENT DOCUMENTS 4,264,647  4/1981  Trevorrow ........................ 427/282
4,316,785  2/1982  Suzuki et al. ..................... 427/63

FOREIGN PATENT DOCUMENTS 56-85814  7/1981  Japan .

OTHER PUBLICATIONS

Harris "Substrates", Chapt. 9, Thin Film Technology by Berry et al., R. E. Krieger Publishing Company 1979, New York.

Bednorz et al., "Possible High $T_c$ Superconductivity in the Ba-La-Cu-O System", Z. Phys. B-Condensed Matter 64 p. 189 (1986).

Cava et al., "Bulk Superconductivity at 36 K in $La_{1.8}Sr_{0.2}CuO_4$", Phys. Rev. Lett. vol.58(9) p. 408 (1987).

Wu et al., "Superconductivity at 93 K in a New Mixed-Phase Y-Ba-Cu-O Compound System at Ambient Pressure", Phys. Rev. Lett. vol. 58(9), p. 908 (1987).

Maeda et al., "A New High-$T_c$ Oxide Superconductor without a Rare Earth Element", Jpn. J. Appl. Phys. vol. 27(2) Feb. 1988 L209-210.

Hashimoto et al., "Superconductivity and Substrate Interaction of Screen-printed Bi-Sr-Ca-Cu-O films", Jpn. J. Appl. Phys. vol. 27(3), Mar. 1988, L384-386.

Grant et al., "Evidence for Superconductivity in $La_2Cu\ O_4$", Physical Rev. Lett., vol. 58(23) Jun. 1987, pp. 2482-2485.

Primary Examiner—Shrive Beck
Assistant Examiner—Roy V. King
Attorney, Agent, or Firm—Sixbey, Friedman, Leedom & Ferguson

[57] ABSTRACT

A method of manufacturing a conducting or superconducting film comprises the steps of providing a powdered composition of complex oxide conducting or superconducting materials represented by the general formula: $(La_{1-x}M_x)_yCuO_{4-\delta}$, where M is a member selected from the group of alkali earth metals and mixtures of the alkali earth metals: $x=0$ to 1, $y=1.5$ to 2.5, adding an organic solvent to the powdered composition to form a kneaded paste, printing the paste on a substrate before drying and firing.

8 Claims, 1 Drawing Sheet

PRINTING METHOD OF FORMING OXIDE SUPERCONDUCTING FILMS ON LA2CU O4 SUBSTRATES

This application is a continuation of Ser. No. 170,247, filed Mar. 18, 1988, now abandoned.

FIELD OF THE INVENTION

The present invention is related to a method of manufacturing a conducting or superconducting thin film.

BACKGROUND OF THE INVENTION

Conducting materials are to be hopefully used for varistors, sensors, and the like, while superconducting materials are also used for coil conductive wires (which show large electrical power losses), Josephson elements or magnetic shield material, and the like, because they demonstrate zero electrical resistance, Josephson effect, and full diamagnetism characteristics and the like.

As superconducting materials, conventionally, alloys such as niobium-tin alloys (which have critical temperature 18° K.), niobium-germanium alloys (which have critical temperature 23° K.) and the like were commonly known. The possibility of superconducting bodies with high critical temperatures made from complex oxides such as $(La_{1-x}Ba_x)_2CuO_4$ was suggested according to Bednorz and Muller, 1987. Uchida et al confirmed in 1987 that these compounds have a high critical temperate of 30° K. which had not been experienced. And then, active research has been carried out on these materials.

It was discovered by Kislo et al in 1987 that the composition of $(La_{0.9}Sr_{0.1})_2CuO_4$ has a high critical temperature of 37° K. Further, professor Chu of Houston University and his colleagues discovered in 1987 high temperature complex oxide superconducting material at the high temperature of 98° K., exceeding the temperature of liquid nitrogen. In particular, considerable interest has been generated in a superconducting material of a composition which can be represented by the general formula: $(La_{1-x}M_x)_yCuO_{4-\delta}$, where M is an alkali earth metal or a mixture of such alkali earth metals; $x=0$ to 1, $y=1.5$ to 2.5; and $\delta=0$ to 1; or the general formula: $(N_{1-x}M_x)_pCu_qO_{7-\delta}$ where N is Sc, Y, or a lanthanide; M is an alkali earth metal or a mixture of such alkali earth metals, $x=0$ to 1, $y=1.5$ to 2.5, $p=2.5$ to 3.5, $q=1.5$ to 3.5, and $\delta=0$ to 1.

However, this type of complex oxide material is a variety of ceramic which can only be obtained in powder form, or, as a fired body in bulk form obtained by using that powder as raw material, and, after forming under pressure, providing heat treatment at a high temperature.

For this reason, it is not possible in practice to use this material as a Josephson element, which is a high speed switching element, or as a wire rod for various types of devices, so it is necessary to obtain it in film form.

SUMMARY OF THE INVENTION

An object of the present invention is to provide, with the consideration to the drawbacks of such conventional materials, a method of manufacturing an electronic material, for example, a superconducting thin film, using the above-mentioned complex oxide material as the raw material, so that a superconducting material of complex oxide can be easily utilized.

Another object of the present invention is to provide a method of screen printing and firing to form a thin film in which superconductivity is maintained even after the film is formed, whereby a conducting or super conducting film can be produced, and a superconducting material of a complex oxide material can easily be utilized.

In the present invention, a method of manufacturing a conducting or superconducting film is comprised of the steps of providing a powdered composition of complex oxide conducting or superconducting materials, adding an organic solvent to the powdered composition to form a kneaded paste, printing the paste on a substrate before drying and firing.

BRIEF DESCRIPTION OF THE DRAWINGS

These and other objects, features and advantages of the present invention will become more apparent from the following description of the preferred embodiments taken in conjunction with the accompanying drawings, in which.

DETAILED DESCRIPTION OF THE PREFERRED EMBODIMENTS

Figure 1:
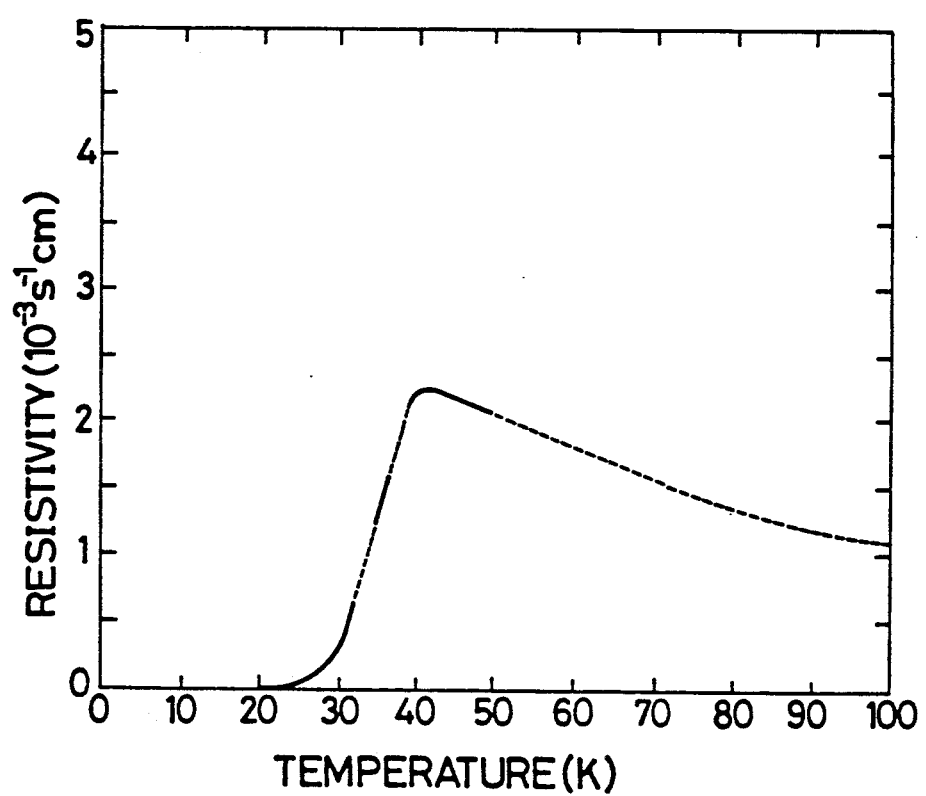
FIG. 1 is a graph showing the result of measurements of the electrical resistivity at low temperatures of a thin film of a second example of the present invention.

To satisfy the objects of the present invention, a method of manufacturing the conducting or superconducting thin film of the present invention is provided wherein an organic solvent is added to a powder of conducting or superconducting complex oxide materials to form a paste which is kneaded, and then screen printed onto a substrate, then dried, and fired.

As a conducting or superconducting complex oxide material, many compositions can be used optionally to conform to the objectives and conditions of use. For example, materials which can be used have a composition represented by the general formula: $(La_{1-x}M_x)_yCuO_{4-\delta}$, where M is a member selected from the group of alkali earth metals and mixtures of the alkali earth metals; $x=0$ to 1, $y=1.5$ to 2.5; $\delta=0$ to 1; or by the general formula: $(N_{1-x}M_x)_pCu_qO_{7-\delta}$ where N is an element selected from the group of Sc, Y and a lanthanide; M is a member selected from the group of alkali earth metals and mixtures of the alkali earth metals; $x=0$ to 1, $y=1.5$ to 2.5, $p=2.5$ to 3.5, $q=1.5$ to 3.5, and $\delta=0$ to 1.

For the organic solvent which is added to the complex oxide material and then kneaded to form a paste, solvents with a boiling point of 150° C. to 200° C. are used, which are easy to dry, have a certain degree of viscosity, and are easily printed. For example, octyl alcohol, propylene glycol, heptyl alcohol, and the like can be preferably used.

As a substrate, a material such as quartz, alumina, zirconia, $La_2CuO_4$ which does not react with the conducting or superconducting complex oxide material, and can withstand the firing temperature, can be used.

As a means for screen printing, any commercially available screen printing machine may be used, employing any usual methods.

A suitable temperature range for firing the material is 700° C. to 1000° C.

EXAMPLE 1

After slurrying $La_2O_3$, $SrCO_3$, and CuO in a prescribed ratio in ethanol, the mixture was fired at 900° C. for 16 hours.

The resulting $(La_{0.9}Sr_{0.1})_2CuO_{4-\delta}$ was then powdered. 0.8 ml of heptyl alcohol were added to 2 grams of this powder and mixed into a paste.

This paste was screen printed onto a zirconia substrate to form a thin film, using a commercially available screen printing machine. After drying under vacuum for 6 hours at 130° C., the thin film was fired at 1000° C. for 10 minutes. The thickness of the resulting film was gravimetrically assumed on the basis of weight increase to be 15 to 20 μm.

The electrical resistivity of the thin film was measured, and was seen to suddenly decrease at 42° K. and become zero at 8° K.

EXAMPLE 2

The material was formed in the same manner as in the first example.

The resulting $(La_{0.9}Sr_{0.1})_2CuO_{4-\delta}$ paste was screen printed onto an $La_2CuO_4$ substrate using a commercially available screen printing machine, and after drying under vacuum for 6 hours at 150° C., was fired at 1000° C. for 10 minutes. It was then annealed at 500° C. for 10 hours. The thickness of the resulting film was gravimetrically assumed from weight increase to be 15 to 20 μm.

The electrical resistivity of the thin film formed in this manner was found to suddenly decrease at 43° K., and the resistance becomes zero at 25° K.

FIG. 1 is a graph showing the result of measurements of the electrical resistivity at low temperatures of a film of this second example of the present invention, wherein the ordinate indicates the electrical resistivity in $10^{-3}S^{-1}$ cm while the abcissa does the absolute temperature in °K.

In the present invention, another type of ceramic compositions can be used for the superconducting ceramic material.

Specifically, the superconducting ceramic material for use in accordance with the present invention may be prepared consistent with the stoichiometric formula $(A_{1-x}B_x)_yCu_zO_w$, where A is one or more elements of Group IIIa of the Periodic Table, e.g. the rare earth elements; B is one or more elements of Group IIa of the Periodic Table, e.g. the alkaline earth metals including beryllium and magnesium, and x=0 to 1; y=2.0 to 4.0, preferably 2.5 to 3.5; z=1.0 to 4.0, preferably 1.5 to 3.5; and w=4.0 to 10.0, preferably 6.0 to 8.0. Also, superconducting ceramics for use in accordance with the present invention may be prepared consistent with the stoichiometric formula $(A_{1-x}B_x)_yCu_zO_w$, where A is one or more elements of Group Vb of the Periodic Table such as Bi, Sb and As. B is one or more elements of Group IIa of the Periodic Table, e.g., the alkaline earth metals including beryllium and magnesium, and x=0 to 1; y=2.0 to 4.0, preferably 2.5 to 3.5; z=1.0 to 4.0, preferably 1.5 to 3.5; and w=4.0 to 10.0, preferably 6.0 to 8.0. One example of the former formula is $YBa_2Cu_3O_x$ (x=6 to 8), and examples of the latter formula are $BiSrCaCu_2O_x$ and $Bi_4Sr_3Ca_3Cu_4O_x$. In addition, the composition $Bi_4(Sr_yCa_2)Cu_4O_x$ is possible for such purposes and its Tc is 40 to 60 when the value of y is about 1.5. The Tconset and Tco of the composition $Bi_4Sr_4Ca_2Cu_4O_x$ are 110° K. AND 79° K., respectively. The value of x in the above formulae is estimated to be 6 to 10, for example about 8.1.

The stoichiometric formulae mentioned above can be determined for example by X-ray diffraction.

The following example is directed to the composition using the V Group as mentioned previously.

EXAMPLE 3

$Bi_2O_3$, $SrCo_3$, $CaCO_3$, and CuO powders were mixed in a prescribed ratio and pre-fired at 800° C. for 12 hours, so that two types of ceramic powder, $Bi_2Sr_2Ca_2Cu_2O_x$ (Powder A), and $Bi_2Sr_2Ca_2Cu_3O_x$ (Powder B) were prepared. In addition, the previously mentioned oxide and carbonate raw materials were simply mixed in the atomic ratio of Bi:Sr:Ca:Cu=1:1:1:2 to prepare a powder mixture (Powder C).

0.5 ml of octyl alcohol were added to 1 gram of these powders together in an agate mortar and kneaded into a paste, then printed with a 150 mesh screen onto each type of substrate, that is quartz, alumina, YSZ (zirconia stabilized with 2.5% Y), and $SrTiO_2$ monocrystals.

After drying under high vacuum for 3 hours at 120° C., these screen printed films were fired for one hour at a prescribed temperature between 830° C. to 900° C. The film thickness was determined to be 10±2 μm after fired.

What is claimed is:

1. A method of producing copper oxide superconducting films comprising the steps of:

providing a powdered composition conforming to a copper oxide superconducting ceramic composition, wherein the copper oxide superconducting ceramic is represented by the general formula:

$(La_{1-x}M_x)_yCuO_{4-\delta}$, where M is a member selected from the group consisting of alkali earth metals and mixtures of the alkali earth metals and where x is a value which provides said copper oxide superconducting ceramic composition, y=1.5 to 2.5 and $\delta$=0 to 1;

adding said powdered composition to a solvent in order to produce a paste, said solvent comprising at least one of octyl alcohol, propylene glycol and heptyl alcohol;

printing said paste on a substrate comprising $La_2CuO_4$ in order to form a precursor superconducting film;

firing said printed film at 700° C.-1000° C.; and increasing at least the critical temperature of the fired film by effecting thermal annealing at approximately 500° C. thereof.

2. The method of claim 1, further comprising the step of drying said printed film before said firing step.

3. The method of claim 1, wherein the step of printing is screen printing.

4. A method of producing copper oxide superconducting films comprising the steps of:

providing a powdered composition conforming to a copper oxide superconducting ceramic composition, wherein the copper oxide superconducting ceramic is represented by the general formula:

$(N_{1-x}M_x)_pCu_qO_{7-\delta}$, wherein N is an element selected from the group of Sc, Y and a lanthanide; M is a member selected from the group consisting of alkali earth metals and mixtures of the alkali earth metals; where x is a value which provides said copper oxide superconducting ceramic composition, p=2.5 to 3.5, q=1.5 to 3.5, and $\delta$=0 to 1;

adding said powdered composition to a solvent in order to produce a paste, said solvent comprising at least one of octyl alcohol, propylene glycol and heptyl alcohol;

printing said paste on a substrate comprising $La_2CuO_4$ in order to form a precursor superconducting film;

firing said printed film at 700° C.-1000° C.; and increasing at least the critical temperature of the fired film by effecting thermal annealing at approximately 500° C. thereof.

5. The method of claim 4, further comprising the step of drying said printed film before said firing step.

6. The method of claim 4, wherein the step of printing is screen printing.

7. The method of claim 1 where said superconducting ceramic is $(La_{0.9}Sr_{0.1})_2 CuO_{4-\delta}$.

8. The method of claim 4 where in said superconducting ceramic, N is Y, M is Ba, and the Y:Ba:Cu stoichiometric ratio is 1:2:3.

* * * * *